United States Patent
Liu et al.

Patent Number: 5,742,163
Date of Patent: Apr. 21, 1998

[54] MAGNETIC RESONANCE SCAN CALIBRATION AND RECONSTRUCTION TECHNIQUE FOR MULTI-SHOT, MULTI-ECHO IMAGING

[75] Inventors: Haiying Liu, Euclid; Gordon D. DeMeester, Wickliffe; James M. McNally, Chagrin Falls, all of Ohio

[73] Assignee: Picker International, Inc., Highland Heights, Ohio

[21] Appl. No.: 638,643

[22] Filed: Apr. 26, 1996

[51] Int. Cl.[6] ................................................ G01V 3/00
[52] U.S. Cl. .................................. 324/309; 324/307
[58] Field of Search .............................. 324/309, 307, 324/306, 314, 312, 300; 128/653.2

[56] References Cited

U.S. PATENT DOCUMENTS

| | | | |
|---|---|---|---|
| 5,151,656 | 9/1992 | Maier et al. | 324/309 |
| 5,531,223 | 7/1996 | Hatanaka | 324/309 |
| 5,557,204 | 9/1996 | Lenz | 324/309 |
| 5,581,184 | 12/1996 | Heid | 324/309 |
| 5,652,514 | 7/1997 | Zhang et al. | 324/309 |

FOREIGN PATENT DOCUMENTS

| | | |
|---|---|---|
| 0 250 050 | 12/1987 | European Pat. Off. . |
| 0 280 310 | 8/1988 | European Pat. Off. . |

OTHER PUBLICATIONS

"Cartesian Echo Planar Hybrid Scanning with Two to Eight Echoes", Kashmar, et al. IEEE Trans on Medical Imaging, V. 10, N. 1, Mar. 1991.

"Interleaved Echo Planar Imaging on a Standard MRI System", Butts, et al. MRM 31:677–72 (1994).

"Ultrafast Interleaved Gradient–Echo–Planar Imaging on a Standard Scanner", McKinnon, MRM 30:609–616 (1993).

*Primary Examiner*—Louis M. Arana
*Attorney, Agent, or Firm*—Fay, Sharpe, Beall, Fagan, Minnich & McKee

[57] ABSTRACT

A sequence control (40) causes a transmitter (24) and gradient amplifiers (20) to transmit radio frequency excitation and other pulses to induce magnetic resonance in selected dipoles and cause the magnetic resonance to be focused into a series of echoes in each of a plurality of data collection intervals following each excitation. A receiver (38) converts each echo into a data line. Calibration data lines having a close to zero phase-encoding are collected during each of the data collection intervals. The calibration data lines in each data collection interval are zero-filled (86) to generate a complete data set and Fourier transformed (88) into a series of low resolution complex images ($90_1$, $90_2$, . . . $90_n$), each corresponding to one of the data collection intervals. The low resolution images are normalized (92) and their complex conjugates taken (94). Imaging data lines are sorted by a data collection interval and zero-filled (104) to create full data sets. The full data set corresponding to each data sampling interval is Fourier transformed into partial image representations ($106_1$, $106_2$, $106_n$). Each partial image is multiplied (108) by a complex conjugate of the normalized phase correction map (96) to create corrected partial images which are summed (112) to generate a composite image (114). The composite images are density corrected (120).

20 Claims, 9 Drawing Sheets

MAGNETIC RESONANCE SCAN CALIBRATION AND RECONSTRUCTION TECHNIQUE FOR MULTI-SHOT, MULTI-ECHO IMAGING

BACKGROUND OF THE INVENTION

The present invention relates to the magnetic resonance arts. It finds particular application in conjunction with echo planar imaging (EPI) and will be described with particular reference thereto. However, it is to be appreciated that the present technique is also applicable to other rapid imaging sequences with repeated gradient echoes, spin echoes, or combinations of gradient and spin echoes, such as echo volume imaging (EVI) techniques, fast spin echo (FSE) techniques, and gradient and spin echo (GSE) techniques.

Heretofore, magnetic resonance imaging subjects have been positioned in a temporally constant magnetic field such that selected dipoles preferentially align with the magnetic field. A radio frequency pulse is applied to cause the preferentially aligned dipoles to resonate and emit magnetic resonance signals of a characteristic resonance radio frequency. The radio frequency magnetic resonance signals from the resonating dipoles are read out for reconstruction into an image representation.

In a two-dimensional Fourier transform imaging technique, a read gradient is applied during the read out of the echo for frequency encoding along a read axis and a phase-encode gradient is pulsed to step phase-encoding along a phase-encode axis between echoes. In this manner, each echo generates a data line in k-space. The relative phase-encoding of the data lines controls their relative position in k-space. Conventionally, the data line with zero phase-encoding extends across the center of k-space. Data lines with a phase-encoding gradient stepped in progressively positive steps are generally depicted as being above the center line of k-space; and, data lines with progressively negative phase-encoding steps are depicted as being below the center line of k-space. In this manner, a matrix, such as a 256×256 or a 512×512, etc., matrix of data values in k-space is generated. Fourier transformation of these values generates a conventional magnetic resonance image.

To strengthen the received magnetic resonance signals, the initial signal is commonly refocused into an echo. This may be done by reversing the polarity of a magnetic field gradient to induce a field or gradient echo. Analogously, the radio frequency excitation pulse may be followed with a 180° pulse to refocus the signal as a spin echo. Moreover, by repeating the reversing of the magnetic field gradient, a series of gradient echoes can be generated following each radio frequency excitation pulse. Analogously, a series of spin echoes can be generated following each radio frequency excitation pulse by repeating the 180° radio frequency refocusing pulse. As yet another option, a single radio frequency excitation pulse can be followed by a mixture of spin and gradient echoes. See, for example U.S. Pat. No. 4,833,408 of Holland, et al.

In a single shot echo planar imaging (EPI) sequence using a gradient system which has a slew rate on the order of 20 mT/m/ms and a gradient strength 15 mT/m, a single radio frequency excitation pulse of arbitrary tip angle can be followed by a sufficient number of gradient reversals to generate an entire set of data lines. The magnetic resonance data from the object is collected during a series of echoes with an oscillatory read gradient that encodes the image object in the direction of the field gradient. See, e.g., P. Mansfield, J. Phys. Chemistry, Vol. 10, pp. L55–L58 (1977). In addition, a series of phase-encoding gradient pulses orthogonal to the read gradient direction are applied before each echo to step the data lines through k-space. The image of the object is preferably obtained with two one-dimensional Fourier transforms of the echo data. This single shot EPI technique offers an ultra fast imaging technique for true dynamic imaging in a sub-second time scale.

However, the single shot EPI technique has drawbacks, including a relatively low signal-to-noise ratio (particularly for the echoes near the end of the sequence), low spatial resolution, chemical shift artifacts, geometric distortion along the phase-encode direction, and the like. Due to an intrinsic low data sampling bandwidth along the phase-encoding direction, single shot EPI techniques tend to suffer geometric distortion caused by field inhomogeneity which can be severe, as well as chemical shift artifacts.

Multi-shot EPI techniques reduce the above-noted drawbacks of single-shot EPI techniques. In traditional multi-shot EPI imaging, phase-frequency space or k-space is divided into a plurality of segments, e.g., 4–16 segments. After resonance excitation, the read gradient is oscillated to generate a train of echoes, hence data lines, in each of the segments of k-space. After another excitation, a different one of the data lines in each segment is generated. This process is repeated until k-space is filled in this interleaved fashion.

During data acquisition, sliding sampling window techniques can be used to smooth out or help match the phase and intensity discontinuities in the data. See, Butts, et al., "Interleaved Echo Planar Imaging on Standard MRI System", Mag. Res. Med., Vol. 31, pp. 67–72 (1994) or McKinnon, "Ultra Fast Interleaved Gradient-Echo-Planar Imaging On a Standard Scanner", Mag. Res. Med., Vol. 30, pp. 609–619 (1993). The sliding window technique helps smooth phase and amplitude transition between each pair of contiguous segments of k-space. This reduces ringing artifacts in the final reconstructed image.

Another prior art technique for reducing artifacts which arise from phase discontinuity between the k-space segments is based on a spatially, one-dimensional phase-correction. More particularly, a first order phase-correction for the data lines is made from different echoes. See, U.S. Pat. No. 5,151,656 of Maier, et al.

The present invention is directed to a new and improved data acquisition technique which overcomes the above-referenced problems and others.

SUMMARY OF THE INVENTION

In accordance with the present invention, there is provided an apparatus and method for magnetic resonance imaging. A two-dimensional phase-correction processor generates a plurality of two-dimensional phase-correction matrices. The two-dimensional phase-correction processor receives data lines generated from echoes and independently generates a corresponding two-dimensional phase-correction matrix for each of a plurality of data collection intervals. A partial image processor receives image data and reconstructs an incomplete set of data lines collected during a data collection interval into a corresponding partial image. A matrix multiplier multiplies each partial image by the two-dimensional phase-correction matrix corresponding to the same data collection interval to generate a plurality of two-dimensionally phase-corrected partial images. An image adder adds the two-dimensionally phase-corrected partial images to generate a composite image.

In accordance with a more limited aspect of the invention, a Fourier transform processor processes calibration data lines to generate a spatial low resolution complex image, and a processor normalizes the low resolution image.

In accordance with a more limited aspect of the invention, the two-dimensional phase-correction processor receives data lines corresponding to only one of a plurality of segments of k-space corresponding to each data collection interval. A zero-filling means fills each segment of k-space with no collected data with zeros to create a complete data set for Fourier transformation into the phase map.

In accordance with a more limited aspect of the invention, a filter filters each calibration data line.

In accordance with another limited aspect of the present invention, a density correction processor point by point corrects the composite image with a density correction matrix to generate a density-corrected composite image.

One advantage of the present invention is that it provides two-dimensional phase-correction.

Another advantage of the present invention is that it facilitates acquisition of multiple shot EPI image data.

Another advantage of the present invention is that a hardware upgrade is not required.

Another advantage of the present invention is that it improves image quality, particularly in terms of improving spatial resolution and reducing Gibbs ringing and distortion.

Another advantage of the present invention is that the technique does not add a significant increase in scan time.

Another advantage of the present invention is that the technique offers a more robust and reliable phase correction.

Yet another advantage of the present invention is that it can reduce the amount of data to be saved temporally for calibration.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1A:
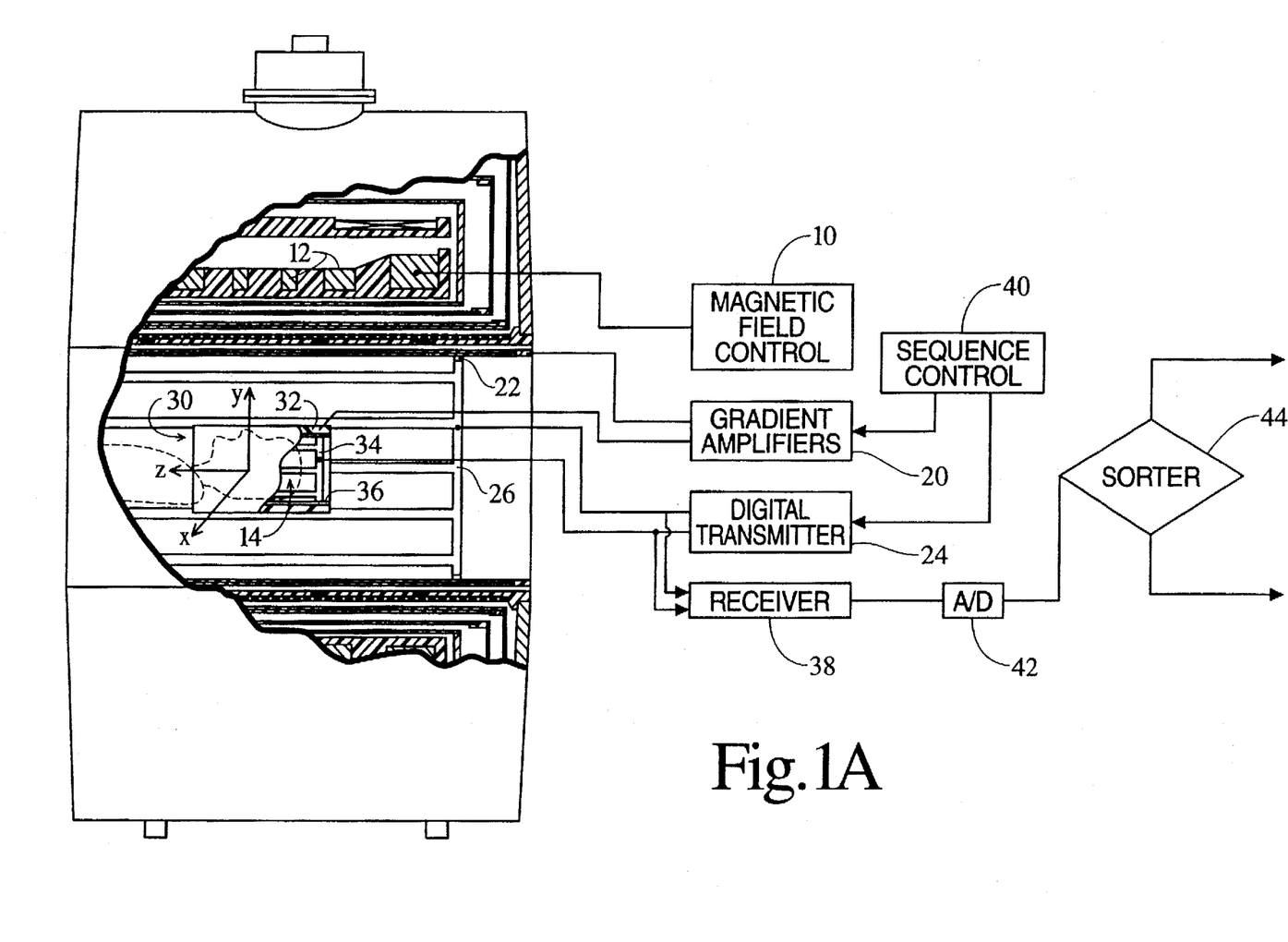
FIGS. 1A and 1B taken together are a diagrammatic illustration of a magnetic resonance imaging system in accordance with the present invention.

With reference to FIG. 1A, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate spins, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil 30 preferably includes local gradient coils 32 which receive current pulses from the gradient amplifiers 20 to create magnetic field gradients along x, y, and z-axes in the examination region within the head coil 30. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38.

A sequence control circuit 40 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. For the selected sequence, the receiver 38 receives a plurality of data lines in rapid succession following each RF excitation pulse. Preferably, the receiver 38 is a digital receiver or, as shown here, is accompanied by an analog-to-digital converter 42 for converting each data line into a digital format.

Figure 1B:
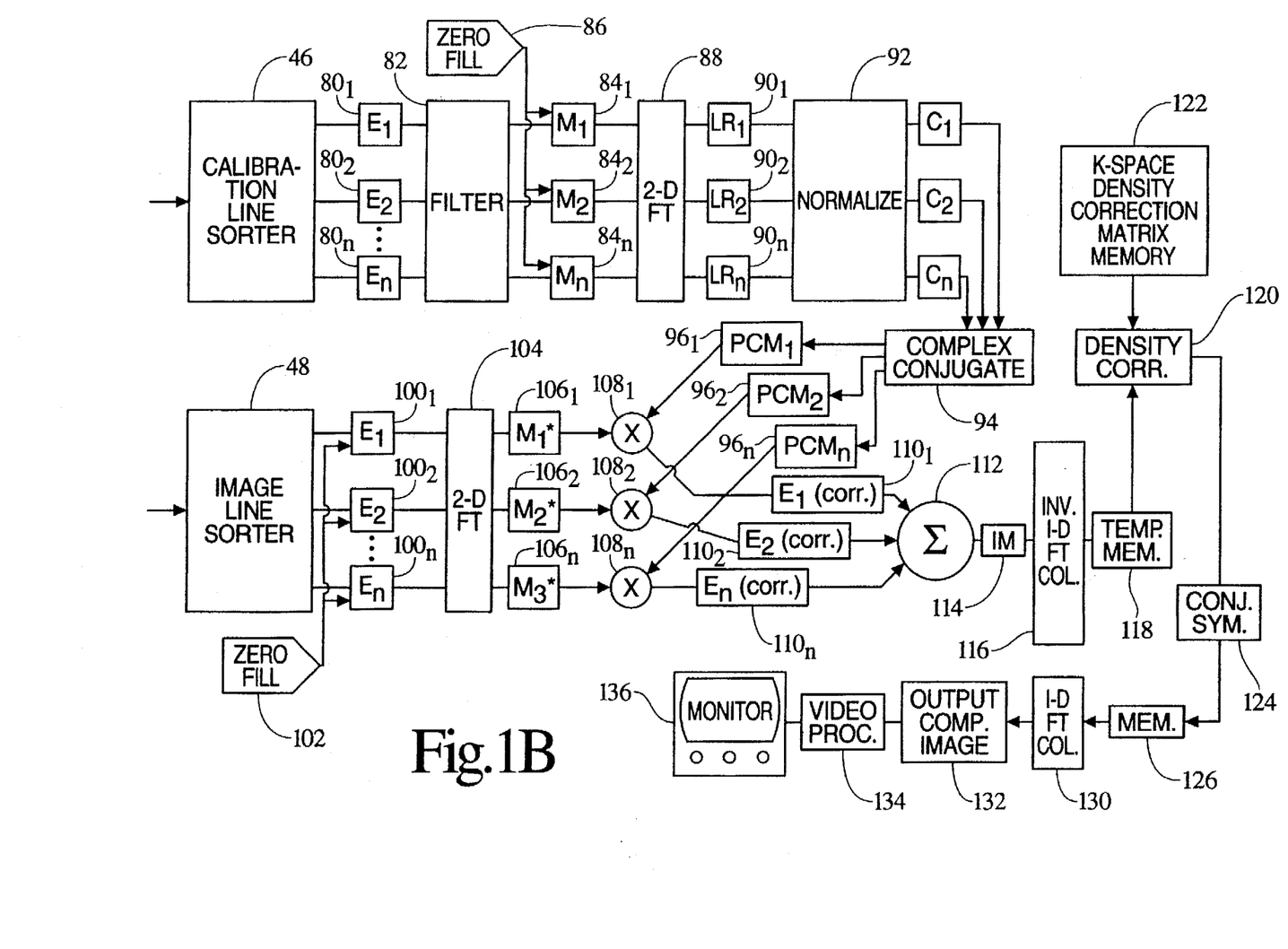

Referring to FIGS. 1A and 1B, the digital data lines are first sorted 44 between calibration data lines and image data lines. The calibration data lines are sorted 46 by echo numbers among k-space, from segments 1 through n. Analogously, image data lines are sorted 48 among the n segments of k-space.

Figure 2:
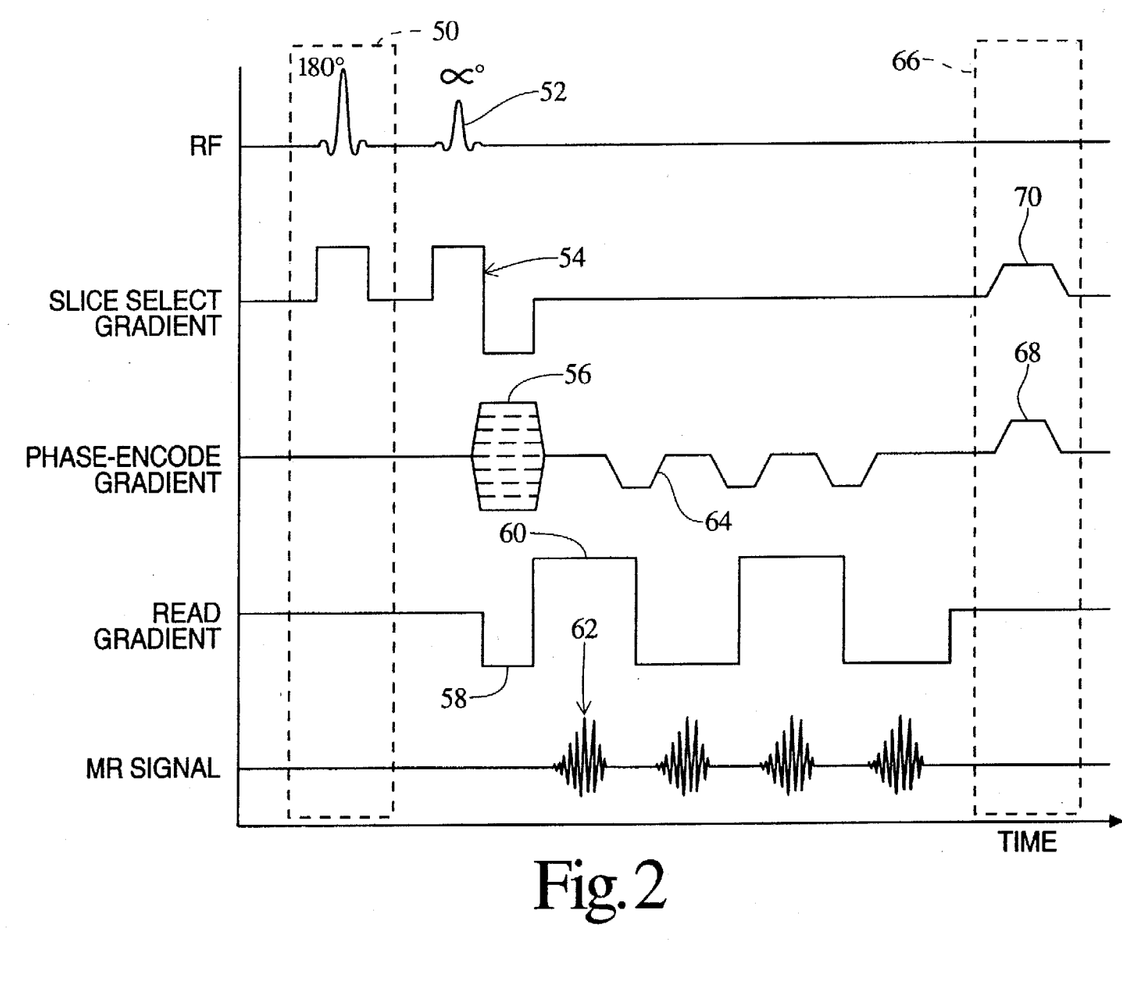
FIG. 2 illustrates one repeat of a preferred echo planar imaging sequence.

With reference to FIG. 2, the echo planar imaging sequence may optionally commence with a conditioning routine 50, such as a 180° inversion pulse with a slice select gradient pulse. By incorporating an appropriate delay, inversion recovery images, for example, can be generated. A radio frequency excitation pulse 52 is applied concurrently with a slice select gradient 54 to tip the magnetization by a selected tip angle, e.g., the Ernst angle, within a selected slice. A phase-encode gradient 56 steps to an initial one of the n segments of k-space. A negative polarity read gradient portion 58 causes dephasing along a read or frequency encode direction. Subsequently, a reverse polarity read gradient portion 60 causes the magnetization to rephase into a gradient echo 62 which is phase-encoded with the phase set by the phase-encode gradient 56. Thereafter, the read gradient is reversed a plurality of times (four in the illustrated embodiment) to generate a corresponding number of gradient echoes. Phase encode gradient pulses 64 are applied between each gradient echo to step the data lines from the subsequent gradient echoes among the n regions of k-space. Thus, the read gradient is reversed n times to generate n gradient echoes, one in each of the n segments of k-space. FIG. 2 illustrates an embodiment in which n=4. A spin echo version of the EPI sequence shown in FIG. 2 is also preferred, in which a refocusing RF pulse is sandwiched between the excitation pulse 52 and read out gradient 60.

After the last gradient echo is read, a dephasing routine 66 is applied. The dephasing routine may include a phase unwrap gradient 68 which is equal to the negative of the sum of the phase-encode gradient 56 and all of the phase-encode gradient pulses 64. The dephasing technique may also include a spoiler gradient 70 for randomizing any residual phase-encoding. This enables the next repetition to follow substantially immediately. Alternately, in multi-slice techniques, the phase-encoding within the slice may be allowed to dephase over time and the sequence repeated immediately to collect n data lines from one of the other imaged slices.

During calibration, the phase-encoding blips 64 are set to zero such that each of the echoes has the same phase-encoding. In each repetition, the initial phase-encoding gradient 56 is stepped to each of a small number of phase-encode values near the zero phase-encode origin. Preferably, the calibration sequence is repeated about 2–64 times, each time with a different phase-encoding, which phase-encoding is common to all n echoes.

With continuing reference to FIG. 2 and further reference to FIG. 1B, the calibration data line corresponding to each echo is sorted 46 to a series of corresponding calibration data line memories $80_1, 80_2, \ldots, 80_n$. Again, in the preferred embodiment, about 2–64 data lines are generated for each of the n echo positions. A filter 82, preferably a Blackman, Hanning, Hamming, or Gaussian filter, filters each of the data lines in the read direction. The filtered data lines are loaded into corresponding calibration data line memories $84_1, 84_2, \ldots, 84_n$. A zero-filling routine 86 fills the empty data lines in the filtered calibration data line memories $84_1, 84_2, \ldots, 84_n$ to form a full, rectangular matrix in the memories $84_1, 84_2, \ldots, 84_n$. A two-dimensional Fourier transform routine 88 performs a two-dimensional Fourier transform on the zero-filled data in each of the filtered calibration data memories $84_1, 84_2, \ldots, 84_n$ to generate a corresponding low resolution complex image for storage in corresponding low resolution image memories $90_1, 90_2, \ldots, 90_n$. The same two-dimensional Fourier transform routine can be used serially to process each of the data lines or, multiple routines can be provided such that the data lines are parallel processed for greater speed. Each of the low resolution complex images is normalized 92, preferably its magnitude is set equal to one. One or a plurality of complex conjugate routines 94 calculate the complex conjugate of each normalized complex low resolution image whose phase represents a phase map. In this manner, two-dimensional phase correction matrices $96_1, 96_2, \ldots, 96_n$ are generated, one for each of the n segments of k-space, i.e., for each of the echo positions.

During image data collection, the image data lines collected from each of the first through the n-th echoes are sorted 48 into image data memories $100_1, 100_2, \ldots, 100_n$, respectively.

The data lines are positioned in the appropriate portion of memory corresponding to the segment of k-space which each represents. A zero-filling routine 102 zero-fills each memory to create square matrices in the image data memories $100_1, 100_2, \ldots, 100_n$. A two-dimensional Fourier transform processor 104 two-dimensionally inverse Fourier transforms each zero-filled square matrix to generate a complex partial image for storage in a corresponding one of complex image memories $106_1, 106_2, \ldots, 106_n$. Image multiplying routines $108_1, 108_2, \ldots, 108_n$ perform a complex multiplication point by point of the complex partial image from the corresponding one of memories $106_x$ and the complex conjugate of the normalized low resolution image from the corresponding one of memories $96_x$. In this manner, the complex partial image corresponding to each echo is corrected in accordance with a phase map corresponding to the same echo. An image summing routine 112 sums the phase-corrected partial images $110_1, 110_2, \ldots, 110_n$ to generate an image for storage in an image memory 114.

The composite image from image memory 114 is inversely Fourier transformed in one dimension along the phase-encode direction by a processor 116 to return the data to k-space only for phase-encode. The k-space data is stored in a temporary memory 118. A density correction processor 120 operates on the composite k-space image data point by point with a density correction matrix retrieved from a density correction matrix memory 122 to generate density corrected k-space data. When k-space segments are overlapped, the k-space sampling density can be corrected by doing a simple normalization. A complex conjugate processor 124 operates on the density corrected data to derive and fill-in the missing data from its complex conjugate data to generate a completed image for storage in an image memory 126.

A processor 130 performs a one-dimensional Fourier transform along the phase-encode direction to transform the density-corrected images of the memory 126 back into image space to generate a density-corrected composite image for storage in an output composite image memory 132. A video processor 134 converts the composite image into appropriate format for display on a video monitor 136 or other human-readable output display device.

Figure 3:
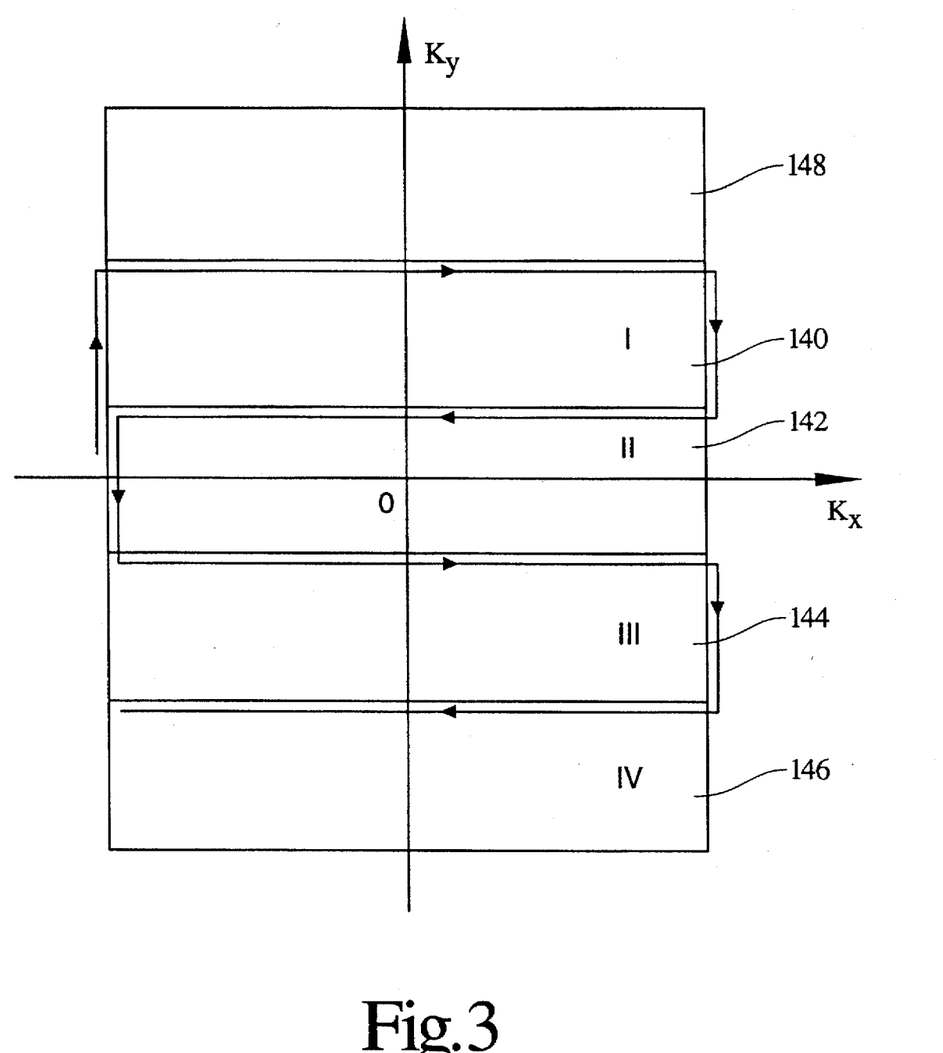
FIG. 3 illustrates an exemplary filling of k-space segments.

The image data lines may be gathered by different trajectories through k-space. Referring to FIGS. 2 and 3, for example, the phase-encode gradient 56 is indexed to the phase-encode step at the top of k-space, which is at the top of the first segment 140, and each of the phase-encode blips 64 steps the phase-encoding to the top data line in the next lowest segment 142 of k-space, to the next lowest segment 144, and to the bottom segment 146. On subsequent repetitions, the phase-encode gradient initially sets the phase-encode step at progressively lower data lines within the initial segment. The data in segment 148 is generated by its complex conjugate relationship to the data in segment 146.

Alternately, rather than starting at one of the n segments, the phase-encode gradient 56 may select a step within one of the central segments. The phase-encode gradient blip 64 might be of various positive and negative polarities and amplitudes such that the phase-encoding is stepped in a preselected order between central, positive, and negative phase-encoding steps stepwise outward. Various other imaging sequences can be devised in which each echo position is always accorded to the same segment of k-space.

Optionally, the phase-encode gradient 56 may be used to control the phase-encoding such that each segment extends a few data lines into the next adjacent segment (not shown in FIG. 3). In this manner, several lines of overlap are generated to insure complete filling of k-space and to assist in the correction of potential phase discontinuities at the segment boundaries.

Figure 4:
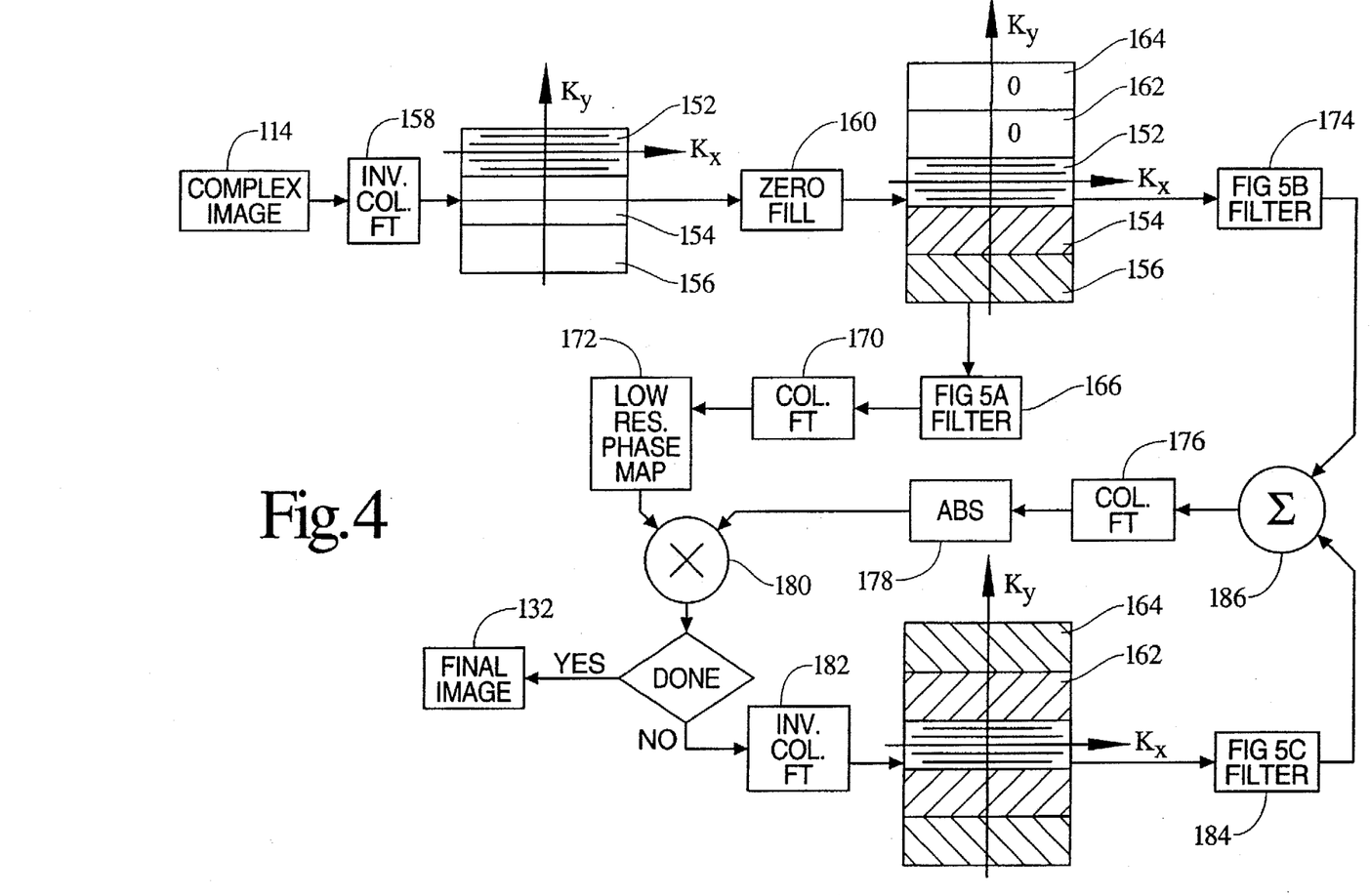
FIG. 4 illustrates an iterative method for partial Fourier reconstruction.
Figure 5A:
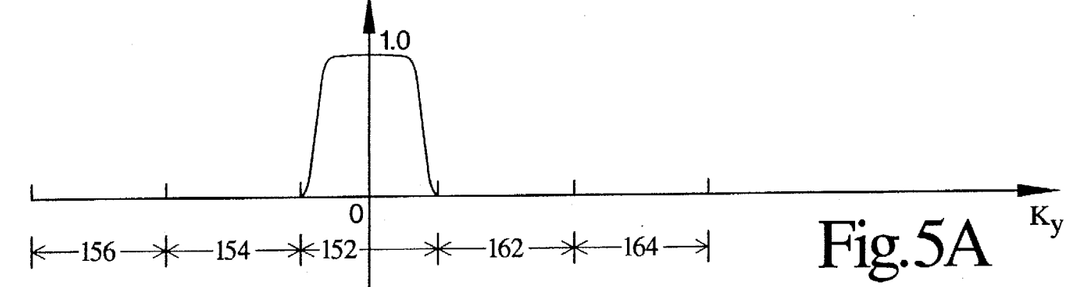
FIGS. 5A, 5B, and 5C illustrate filter functions used in the method of FIG. 4.

With reference to FIGS. 4, 5A, 5B, and 5C, a complex image 114 formed from data in a central section 152 of k-space and two k-space sections 154, 156 to the same side of k-space are inversely Fourier transformed 158 in at least the column or vertical direction to generate a series of one-dimensionally Fourier transformed data lines which fill sections 152, 154, and 156 of k-space, where 152 is at the center of k-space. A zero-filling routine 160 zero-fills two empty segments of k-space 162, 164. A filter 166 as illustrated in FIG. 5A removes all but the data lines in the center section 152 of k-space. More specifically, the filter function produces a smooth transition between a unity value through the center of section 152 to zero values outside of section 152.

The data from the center section of k-space is column Fourier transformed 170, creating a low spatial resolution image from the data of the central k-space section. The complex low resolution image is normalized such that it has an amplitude of unity while preserving its phase. In this manner, a low resolution image phase map is generated for storage in a low resolution phase map memory 172.

Figure 5B:
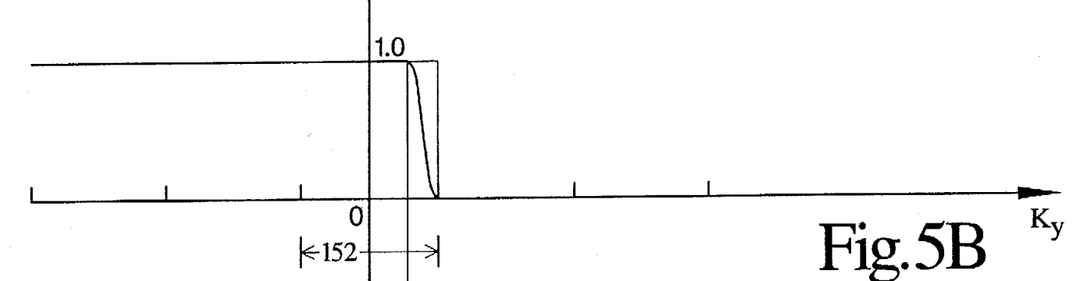

A filter 174 filters the data with the filter of FIG. 5B. The FIG. 5B filter retains all of the data of k-space sections 154 and 156 and most of the data of section 152. However, a smooth transition is provided between the data in section 152 and the zero filled data in sections 162 and 164.

In a first iteration, a one-dimensional Fourier transform processor 176 performs a one-dimensional Fourier transform on the data from the filter 174 in the column direction to generate an image. An absolute value routine 178 removes the phase data from the image. A multiplier 180 also combines the magnitude value for each pixel of the image from the absolute value routine 178 with the corresponding phase from the low resolution phase map 172 to generate a complex image.

The complexed image data formed by the multiplier 180 is inversely one-dimensionally Fourier transformed in the column direction 182 to generate another series of data lines transformed in the row direction which fill k-space. With this process, the zero data lines in sections 162 and 164 of k-space are now replaced with first approximation data lines. A filter 184 filters the data lines with the filter of FIG. 5C to remove all portions of the data except that in sections 162 and 164 and to provide a smooth transition to zero values over the rest of the matrix. It will be noted that between filters 174 and 184, a complete set of data is defined. These two partial data sets are summed 186 and the process repeated. That is, the complete data set with the first approximation data for sections 162 and 164 and the actual data from k-space sections 152, 154, and 156 is Fourier transformed 176 to define a complex image. The phase information is removed 178 and replaced 180 with the phase information from the low resolution phase map 172. When the resultant complex image is inversely Fourier transformed in the column direction 182, it recreates the data set with a second, improved approximation of the data lines for sections 162 and 164 of k-space. This process is repeated with the second approximation data lines for sections 162 and 164 to generate third approximations, and so forth. When the data from sections 162 and 164 is of satisfactory accuracy, as might be determined by when the resultant image is substantially the same as the last iteration, the resultant image is sent to the final image memory 132.

Figure 6:
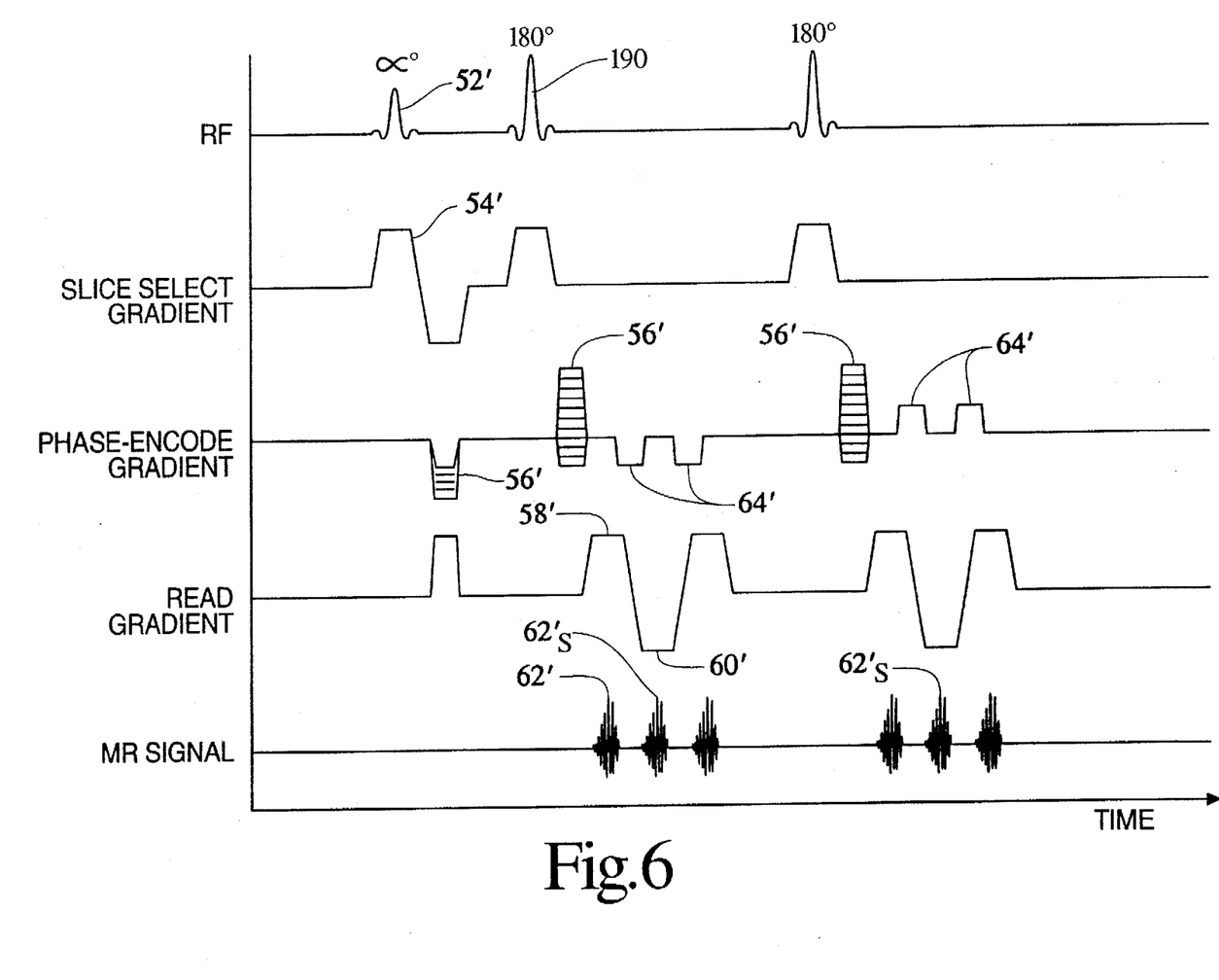
FIG. 6 illustrates a preferred gradient spin echo (GSE) imaging sequence.

With reference to FIG. 6, other driven equilibrium sequences are also contemplated. In FIG. 6, like elements with FIG. 2 are denoted with the same reference numeral, but followed by a prime ('). For example, an $\alpha°$ excitation pulse 52' is followed by a 180° inversion pulse 190. The timing of the gradient echoes 58', 60' is adjusted relative to the 180° refocusing pulse and the excitation pulse such that one of the generated echoes, $62_s'$ is a spin echo and the remainder are gradient echoes. One or more additional 180° pulses are applied to refocus the resonance into subsequent spin echoes.

Figure 7:
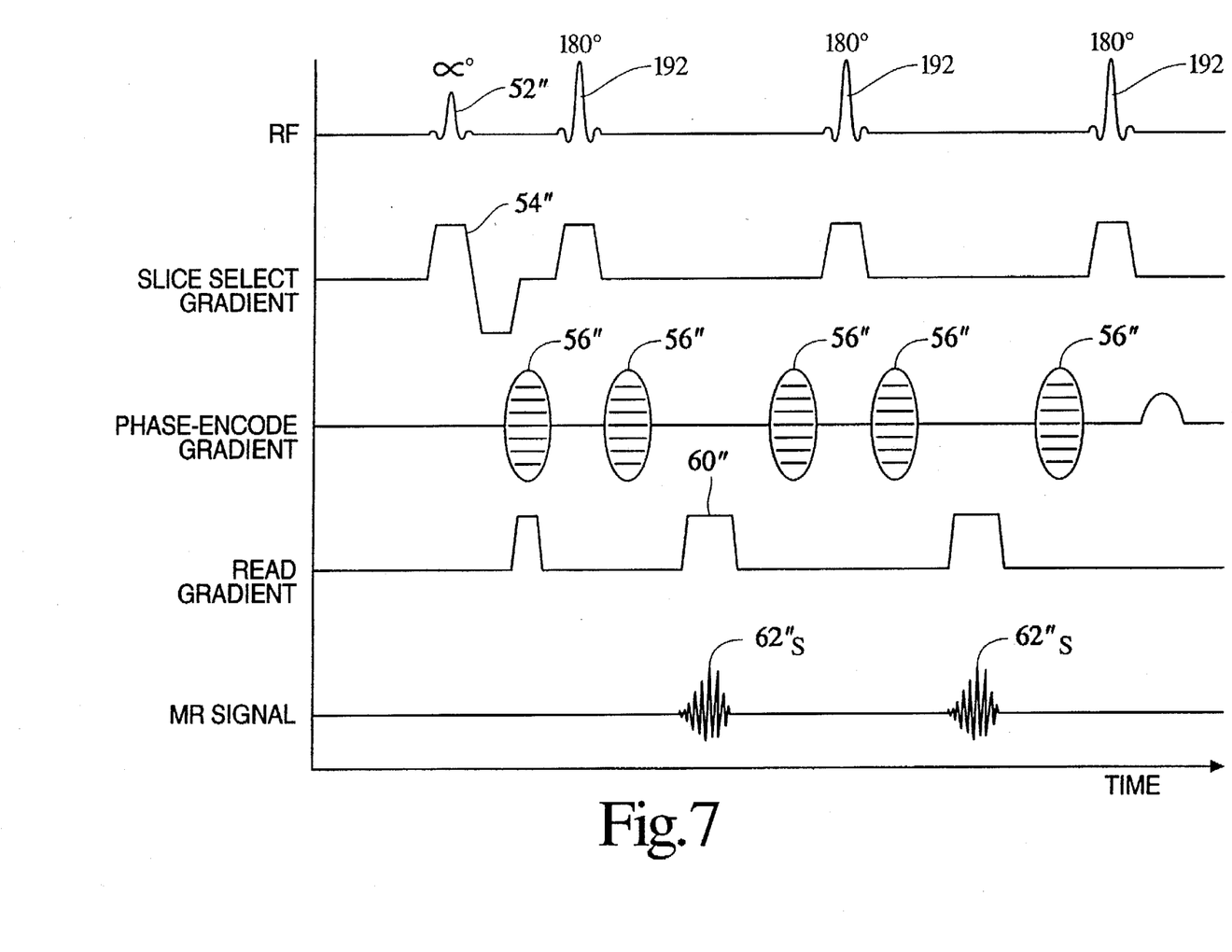
FIG. 7 illustrates a preferred fast spin echo (FSE) sequence.

As illustrated in FIG. 7, in which like elements with FIG. 2 are denoted with the same reference numeral but followed by a double prime ("), when the number of 180° refocusing pulses 192 is increased to match the number of echoes, a series of spin echoes $62_s"$ is generated. Optionally, a gradient echo can be generated between the resonance excitation pulse and the first inversion pulse. The gradient echoes may advantageously be utilized to generate the calibration data lines and may have a reduced bandwidth relative to the spin echoes.

Figure 8:
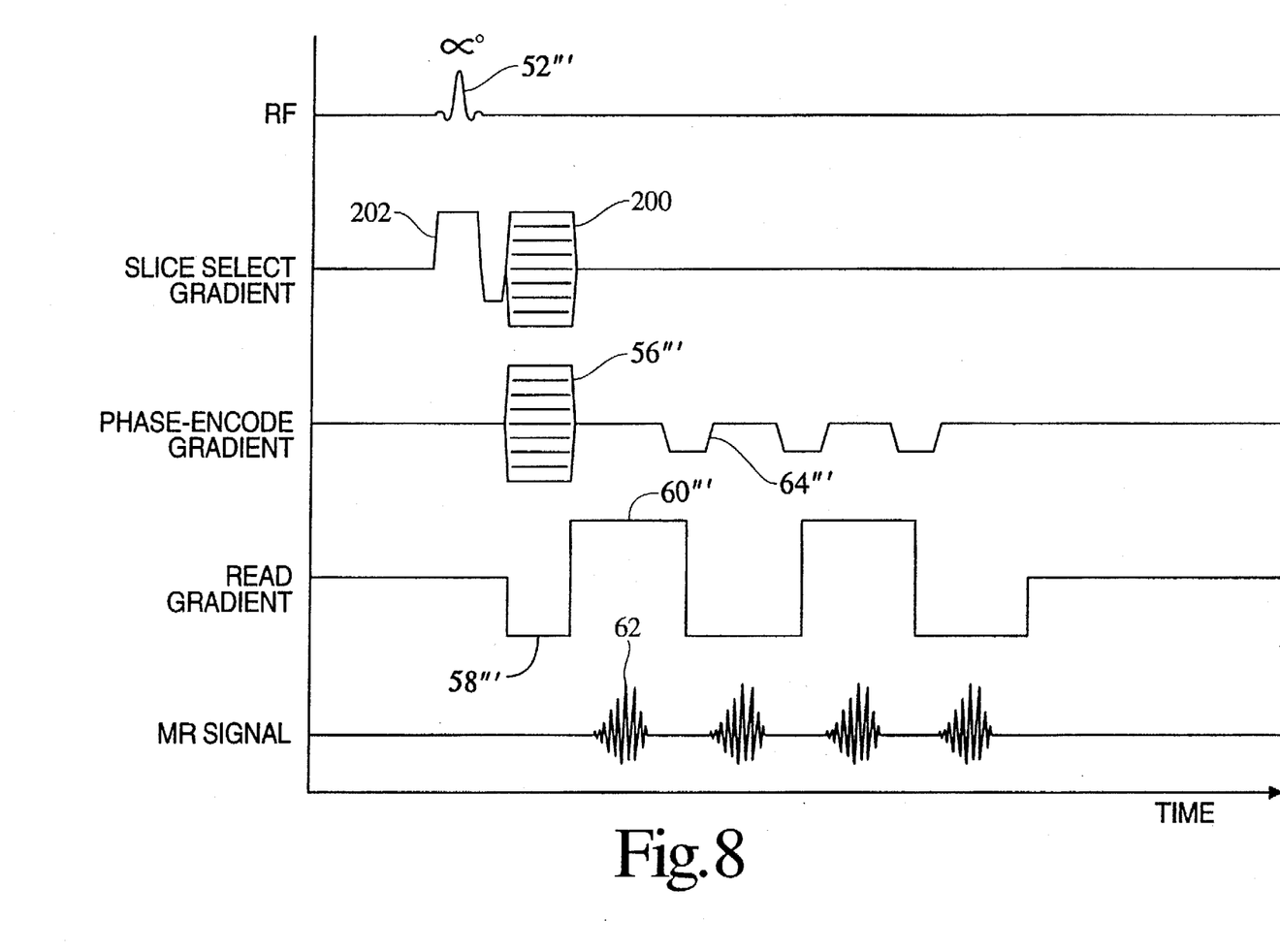
FIG. 8 illustrates a preferred echo volume imaging sequence.

With reference to FIG. 8, in which like elements with the embodiment of FIG. 2 are followed by a triple prime ('''), a phase-encode gradient 200 is applied on the "slice select" axis to step the phase along that direction. In this volume imaging technique, k-space can be envisioned as a three-dimensional rectangular prism. The blips 64'''step through k-space along the phase-encode axis. Preferably, a slab select gradient 202 is applied concurrently with the resonance excitation pulse to limit excitation to a slab.

Referring generally to FIGS. 2 and 3, in order to describe the principles of the invention more clearly, consider the case of a two-dimensional magnetic resonance image with multiple echoes. After the slice selection excitation 52, the resultant magnetic resonance magnetization induction signal of a three-dimensional object with proton spin density $\rho(x,y)$ is given by:

$$R(k_{rd}, k_{pe}, q) = \int \rho(x,y) e^{i(k_{rd}x + \Delta\phi(x,y,q) + k_{pe}y) - \frac{TE(q)}{T_2}} dxdy \quad (1)$$

where q denotes the echo number, $k_{rd}(t)$ and $k_{pe}(t)$ are the k-space trajectory of read-out and phase-encoding gradients, respectively:

$$k_{rd}(t) = \int_0^t G_{rd}(t') dt', \quad (2a)$$

$$k_{pe}(t) = \int_0^t G_{pe}(t') dt', \quad (2b)$$

where $G_{rd}$ and $G_{pe}$ are the time dependent magnetic field read out and phase-encoding gradients during acquisition, and $\Delta\phi(x,y)$ denotes a phase error due to main field inhomogeneity which includes the contribution of both magnet main field and susceptibility. The transverse spin relaxation is taken into account by the term involving $T_2$. Gradient eddy current field effect is not included in this expression for simplicity of calculation.

To speed up a slice selection acquisition, a number of gradient and/or spin echoes are obtained for every spin excitation using an oscillatory read gradient or multiple RF focusing pulses as shown in any of FIGS. 2, 4, 5, and 6.

The calibration data lines that are used for the phase-correction are obtained for all echoes and for all the spatial slices. The calibration data lines can be obtained before, after, or interleaved among a segmented imaging acquisition to minimize the possible motion of anatomy between the image data and the calibration data. Using the same sequence as imaging with a near zero amplitude for the phase-encoding blips 64, the calibration data are obtained for each echo under a set of common phase-encoding steps around the origin of k-space 180. The number of phase-encoding steps can be relatively small or might be the size of one of the segments 162. If the phase-encoding step is the size of one of the segments, the calibration data can be used as image data as well, eliminating the need to collect data from that segment again.

In order to combine multiple phase-encoded data lines acquired from different echoes obtained at various data times into one k-space data area and to form an image free of artifacts, the below-described phase-correction is performed on the data to minimize phase discontinuity between contiguous k-space segments. To reconstruct an image with a two-dimensional inverse Fourier transform, the data from different echoes normally need to be time-shifted or phase-corrected in both read and phase directions.

The field induced phase error maps C(x,y,q) for each echo are determined from a set of two-dimensional calibration data for each echo using a small number of phase-encoding steps symmetrically around the center of k-space:

$$C(x,y,q) = 2D - FT\{r(t,v,q) \cdot f_L(t,v)\}, \qquad (3a)$$

$$= \rho_L(x,y)e^{i\Delta\phi(x,y,q)}, \qquad (3b)$$

where r(t,v,q) represents a raw data line as a function of sampling time t of view v and echo q:

$$r(t,v,q) = r(k_{rd}, k_{pe}, q) \qquad (3c),$$

where $f_L(t,v)$ denotes a two-dimensional smoothing filter function along both phase and read directions and $\phi(x,y,q)$ denotes the low spatial resolution phase estimate for the field error at echo time q. The number of views for the calibration data can be any number, preferably 8, 16, or 32.

A complex unitary two-dimensional image matrix representing a low spatial resolution phase error for echo q is obtained from the q-th echo of the calibration data as:

$$\hat{C}(x,y,q) = \frac{C(x,y,q)}{|C(x,y,q)|}, \qquad (4a)$$

$$= e^{i\Delta\phi(x,y,q)}. \qquad (4b)$$

The acquired imaging data lines are first filtered in the sampling time and can be one-dimensionally inverse Fourier transformed in the order that they are received. At this stage, the one-dimensionally Fourier transformed data lines are sorted with the data lines corresponding to the same echo index forming a contiguous set of k-space segments. As soon as an echo segment denoted by the index integer q is completely filled, that segment is taken out and placed into a two-dimensional complex image data buffer in the corresponding view locations. The rest of the echo segments are then zero-filled 102. A one-dimensional columnar Fourier transform is performed. Alternately, a two-dimensional Fourier transform may be performed after the zero-filling. When using a two-dimensional Fourier transform, an intermediate image of echo q is obtained as:

$$R(x,y,q) = 2D - FT\left\{ r(t,v,q) \cdot \Pi\left( \frac{v - v_0(q)}{v_{seg}} \right) \right\}, \qquad (5a)$$

$$= \delta\rho(x,y)e^{i\Delta\omega(x,y)TE(q)}, \qquad (5b)$$

where $v_{seg}$ is the width of each k-space segment, $v_0$ denotes the center view index of the segment, and where the 2D-FT denotes a discrete two-dimensional Fourier transform along data sampling time (t) and view (v) direction, and $\Pi(x)$ denotes a standard rectangular window function that divides k-space into multiple segments by echo position or time.

In this manner, each image slice of an exemplary four echo multiple shot EPI acquisition produces four intermediate images from a corresponding four k-space segments. These intermediate two-dimensional images are stored in the complex image memories 106.

The two-dimensional phase-correction is performed on each intermediate image corresponding to each k-space data segment independently. Each partial or sub-image R(x,y,q) is corrected in the image domain as:

$$R^c(x,y,q) = R(x,y,q)\{\hat{C}(x,y,q)\}^* \qquad (6),$$

where * denotes a complex conjugate operation. The final corrected complex image is produced by summing 112 all of the individual phase-corrected intermediate images corresponding to different echoes:

$$Im(x,y,E_n) = \sum_q R^c(x,y,q), \qquad (7a)$$

$$= \sum_q R(x,y,q)\{\hat{C}(x,y,q)\}^*, \qquad (7b)$$

where $Im(x,y,E_n)$ represents a final image of pseudo echo time $E_n$, and $E_n$ denotes the echo time of the center k-space data used.

Any two contiguous k-space segments may be overlapped, as well as gapped, after the two-dimensional phase direction. This is determined by examining the k-space trajectory after the two-dimensional phase-correction. Resulting change in k-space sampling density is readily corrected in k-space data.

The waveform of the read gradient pulse for frequency encoding can be trapezoidal, sinusoidal, or any other appropriate shape. The data can be sampled continuously during the entire oscillation period of the read out gradient. If the sample data is not equidistant in k-space, the data is preferably regridded to an equidistant discrete representation.

An appropriate low-pass filter, such as Gaussian, Hanning, and Blackman, centers the signal peak position of the raw data. The low-pass filter can be as general as an n-term cosine expansion formula optimized for the nature of the data collected. For example, the power of the side lobes can be minimized without significant loss of resolution. The calibration data is smoothed with this filter to reduce the noise level in the phase value being determined. The resultant correction two-dimensional phase array includes spatially DC, linear, and high order components. In discrete form, the complex unitary correction vector at a pixel location (i,j) is:

$$\hat{C}(x_i, y_j) = e^{i\phi_{i,j}} \qquad (8)$$

where $\phi_{ij}$ denotes the phase error at a pixel location indexed by a set of integer pair (i,j) and is generally a relatively smooth function in space. Because the phase error is typically a fairly smooth function, only a reduced set of the complex matrix needs to be saved. The matrix can be readily expanded by interpolation prior to the multiplication step.

The effective total k-space data sampling density for all data segments combined is obtained by summing the contribution for all segments:

$$D(k_y) = \sum_{k_0} \left| FT^{-1} \left\{ FT \left\{ \Pi\left(\frac{k-k_0}{m\Delta k}\right) \right\} e^{i\Delta\phi_{k_0}(y)} \right\} \right|, \quad (9)$$

where the different k-space segments can overlap with each other in the original data acquisition. For the purpose of compensating for this non-uniform sampling density in k-space in practice, as soon as the two-dimensional phase corrected subimages are combined in k-space, the combined image is then inversely Fourier transformed back from image space into k-space as:

$$R^{com}(x,y) = \sum_q R^c(x,y,q), \quad (10a)$$

$$r^{com}(x,k_y) = FT_y^{-1}\{R^{com}(x,y)\}, \quad (10b)$$

where the superscript "$com$" stands for the combined image and q is the segment or echo number index. As a convention in this note, R represents an image representation and r represents a raw representation. The signal intensity of the combined k-space data is rescaled point by point according to the sampling density as:

$$r_{new}(x,k_y) = \frac{r^{com}(x,k_y)}{D(k_y)}. \quad (11)$$

The final corrected complex image is reconstructed using a standard two-dimensional Fourier transform as:

$$im(x,y) = FT\{r_{new}(x,k_y)\} \quad (12).$$

The magnitude and phase image is obtained simply by taking absolute and phase values of the complex image as:

$$|FT\{r_{new}(x,k_y)\}|, \text{ phrase } (FT\{r_{new}(x,k_y)\}) \quad (13).$$

Alternately, a standard gridding method for non-equidistant sampling data in k-space can be used to combine and correct the segmented k-space data.

The calibration echo data can be used for image reconstruction for achieving a desired $T_2$ weighting. When used with a phased array coil, the calibration data lines are acquired simultaneously from all RF receiver channels.

The images corresponding to individual receiver coils are corrected and reconstructed separately, and are then combined at the end to produce the final composite image. Both calibration and imaging data can be collected during sharp rising and falling ramp read gradients of a trapezoidal shape. Alternately, sinusoidally shaped read gradients can be used, provided that a corresponding adjustment for the non-linearity in the frequency direction is made.

In an iterative method for partial Fourier reconstruction, suppose that only partial data is available for image reconstruction in one dimension:

$$s(k) = \sum_{m=-\infty}^{+\infty} \rho(m\Delta x) e^{i2\pi mk\Delta x/N}, \quad (14)$$

where s(k) is only defined for partial phase encoding (PE) views shown mathematically as:

$$s(k) = \begin{cases} s(n\Delta k), -n_0 \leq n \leq N/2 \\ \text{unknown, otherwise.} \end{cases} \quad (15)$$

The iteration method includes three steps.

First, a low frequency complex image is obtained with the central symmetrical part data by a zero-filling to full size and filtered Fourier transformation, from which a low frequency phase map is constructed. To reduce the possible edge blurring and ringings in the image reconstruction, a filter (FIG. 5B) along the phase encoding direction is defined as:

$$f(n) = \begin{cases} 1/2\left[1-\cos\left(2\pi\frac{n-n_0}{n_w}\right)\right], (n_0-n_w) \leq n \leq n_0 \\ 1/2\left[1-\cos\left(2\pi\frac{n+n_0}{n_w}\right)\right], -n_0 \leq n \leq (-n_0+n_w) \\ 1, -n_0+n_w \leq n \leq (n_0-n_w) \\ 0, \text{otherwise} \end{cases} \quad (16)$$

where $n_w$ denotes a width of transition region for the filter.

A low spatial resolution image is first determined from the center part of the raw k-space data as:

$$s_c(k) = f_c(k)s(k) \quad (17)$$

$$\rho_L(m\Delta x) = |\rho_L(m\Delta x)|e^{i\phi_L}$$

$$= \sum_{n=-N/2}^{+N/2} s_c(n\Delta k) e^{i2\pi\frac{mn\Delta k\Delta x}{N}}.$$

At same time, a reliable low frequency phase map is defined, which is used as a phase constraint. This phase is a measure of phase error of main field inhomogeneity.

Second, the initial image for the iterative reconstruction is produced as:

$$s_0(k) = w_0(k)s(k) \quad (18),$$

where the filter function $w_0(k)$ (FIG. 5A) is:

$$w_0(k) = \begin{cases} 1, -n_0+n_f \leq n \leq N/2 \\ 1/2\left[1-\cos\left(2\pi\frac{n+n_0}{n_f}\right)\right], -n_0 \leq n \leq (-n_0+n_f) \\ 0, -N/2 \leq n \leq -n_0 \end{cases} \quad (19)$$

Third, iteration is performed as follows. At q-th iteration step, the new complex image is constructed from the previous as:

$$\rho_q(x) = |\rho_{q-1}(x)|e^{i\phi_L(x)} \quad (20).$$

Take the inverse FT, and new raw data is obtained as:

$$s_q(k) = FT^{-1}\rho_q(x) \quad (21)$$

Figure 5C:
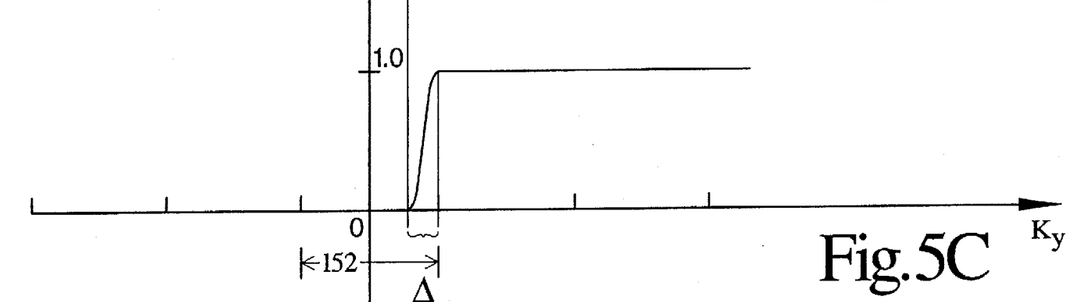

The new raw data of the next iteration is constructed as:

$$s_{q+1}(k) = w(k)s_0(k) + [1-w(k)]s_q(k) \quad (22)$$

where w(k) denotes a weighting function (FIG. 5C), which is defined as:

$$w(k) = \begin{cases} 1, & -n_0 + n_t \leq n \leq N/2 \\ 1/2 \left[ 1 - \cos\left( 2\pi \frac{n+n_0}{n_t} \right) \right], & -n_0 \leq n \leq (-n_0 + n_t) \\ 0, & -N/2 \leq n \leq -n_0 \end{cases} \quad (23)$$

where $n_t$ defines the width of a transition region for the mixing function.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system which includes a magnet for generating a temporally constant magnetic field through an examination region, a radio frequency pulse controller and transmitter for inducing dipoles in the examination region to resonance such that radio frequency resonance signals are generated, gradient magnetic field coils and a gradient magnetic field controller for generating at least phase and read magnetic field gradient pulses in orthogonal directions across the examination region and for repeatedly reversing the read gradient, a receiver for receiving and demodulating the radio frequency magnetic resonance signals after each reversal of the read gradient to produce a series of data lines, and an image memory for storing a reconstructed image representation, the improvement comprising:

a two-dimensional phase-correction processor which generates a plurality of two-dimensional phase-correction matrices, each two-dimensional phase-correction matrix corresponding to one of the read gradient reversals, the two-dimensional phase-correction processor receiving data lines collected at a data collection period following each of the read gradient reversals and independently generating a corresponding two-dimensional phase-correction matrix for each data collection interval;

a partial image processor which receives image data generated during each of the data collection intervals, the partial image processor reconstructing an incomplete set of data lines collected during each of the data collection intervals independently into a corresponding partial image;

a matrix multiplier for multiplying each partial image by the two-dimensional phase-correction matrix corresponding to the same data collection interval to generate a plurality of two-dimensionally phase-corrected partial images;

an image adder for adding the two-dimensionally phase-corrected partial images to generate a composite image for storage in the image memory.

2. In the magnetic resonance imaging system as set forth in claim 1, the improvement further comprising the two-dimensional phase-correction processor including:

a Fourier transform processor for processing calibration data lines corresponding to each data collection interval to generate corresponding low spatial resolution complex image whose phase represents a phase error map;

a processor for normalizing each low spatial resolution complex image; and a complex conjugate processor for calculating a complex conjugate of each normalized low resolution complex image to generate the two-dimensional phase-correction matrix corresponding to each data collection interval.

3. In the magnetic resonance imaging system as set forth in claim 2, the improvement further comprising:

the two-dimensional phase-correction matrix processor receiving data lines corresponding to one of a plurality of segments of k-space corresponding to each data collection interval and further including a zero-filling means for filling with zeros each segment of k-space with no collected data to create a complete data set for Fourier transformation into the low spatial resolution complex image.

4. In the magnetic resonance imaging system as set forth in claim 3, the improvement further comprising:

a filter for filtering each calibration data line.

5. In the magnetic resonance imaging system as set forth in claim 1, the improvement further comprising:

the partial image processor receiving data lines at each data collection interval corresponding to a segment of k-space such that an incomplete data set is collected and further including a zero-filling means for filling portions of k-space with no collected data with zeros to generate a complete data set for reconstruction into the partial images.

6. In the magnetic resonance imaging system as set forth in claim 1, the improvement further comprising:

a k-space sampling density correction processor for point by point correcting the composite image with a density correction matrix to generate a density-corrected composite image.

7. In the magnetic resonance imaging system as set forth in claim 6, the improvement further comprising:

an inverse Fourier transform processor for transforming the composite image into k-space prior to a density correction operation in the density correction processor such that the density correction processor generates density-corrected k-space data; and a Fourier transform processor for transforming the density-corrected k-space data into the density-corrected composite image.

8. In the magnetic resonance imaging system as set forth in claim 1, the improvement further comprising:

a Fourier transform processor for inversely Fourier transforming the composite image to define a series of data lines in a central segment of k-space and a second segment of k-space adjoining the first segment to one side;

a zero filling routine for zero-filling a third segment of k-space adjacent the central k-space section to an opposite side;

a filter for extracting the data lines from the central segment of k-space;

a Fourier transform processor for Fourier transforming the central k-space data lines into a low resolution image phase map;

a filter for passing the data lines from central and second segments of k-space;

a second Fourier transform processor for transforming the data lines from the central and second regions of k-space from the second filter;

an absolute value routine for determining a magnitude of an image representation from the second Fourier transform processor;

a multiplier for combining corresponding magnitudes from the absolute value routine and phase from the low resolution phase map to produce a complex image;

an inverse Fourier transform means for inverse Fourier transforming the complex image to generate a set of data lines including data lines in the central, second, and third k-space segments;

a third filter for passing the data lines from the third segment of k-space;

an adder for combining the data lines from the second and third filters and supplying the data lines to the second Fourier transform processor;

whereby the complex image is iteratively improved with the complex image from the multiplier being taken as a final complex image after a selected number of iterations.

9. In a method of magnetic resonance imaging in which magnetic resonance is excited in dipoles which are induced to form echoes at each of a plurality of data collection intervals following each resonance excitation, the echoes being read out along a read axis in the presence of a read gradient to form a series of data lines for reconstruction into an output image representation, the improvement comprising the steps of:

(a) receiving a plurality of data lines, each collected at one of the data collection intervals;

(b) generating data collection matrices for each data collection interval;

(b) generating a plurality of two-dimensional phase-correction matrices, each phase-correction matrix corresponding to one of the data collection intervals;

(c) reconstructing an incomplete set of data lines collected during each of the data collection intervals into a corresponding partial image;

(d) multiplying each partial image by the phase-correction matrix corresponding to the same data collection interval to generate a plurality of two-dimensionally phase-corrected partial images;

(e) adding the two-dimensionally phase-corrected partial images to generate a composite image.

10. In the method of claim 9, the improvement further comprising:

Fourier transforming calibration data lines corresponding to each data collection interval to generate a low spatial resolution complex image corresponding to each data collection interval;

normalizing each low spatial resolution complex image to generate the two-dimensional phase-correction matrices.

11. In the method of claim 10, the improvement further comprising:

receiving data lines corresponding to each of a plurality of segments of k-space, each corresponding to one of the each data collection intervals; and for each k-space segment, zero-filling portions of k-space with no collected data to create a complete data set for Fourier transforming into the low spatial resolution complex image.

12. The method of claim 11, the improvement further comprising:

filtering each calibration data line.

13. The method of claim 9, the improvement further comprising:

receiving data lines at each data collection interval such that an incomplete data set is collected corresponding to each segment of k-space; and zero-filling portions of each incomplete data set with no collected data to generate a complete data set for reconstruction into the partial images.

14. A method for magnetic resonance imaging comprising:

refocusing magnetic resonance signals to generate echoes;

phase-encoding the echoes to generate data lines tracing along each of a plurality of segments of k-space;

sorting the data lines among the plurality of segments of k-space;

generating phase-correction matrices from the data lines, each matrix corresponding to one of the segments of k-space;

generating a plurality of partial images from the data lines, each partial image corresponding to one of the segments of k-space;

generating a plurality of phase-corrected partial images from the plurality of partial images and phase-correction matrices, each phase-corrected partial image corresponding to one of the segments of k-space; and, summing the phase-corrected partial images to generate a composite image.

15. The method as set forth in claim 14 wherein the phase-correction matrices generating step includes:

Fourier transforming phase-encoded calibration data lines corresponding to each of the segments of k-space to generate a set of low resolution complex images; and, normalizing each low resolution image to generate one of the phase-correction matrices.

16. The method as set forth in claim 15 wherein the phase-correction matrices generating step includes:

for each segment of k-space, zero-filling empty portions of k-space to generate a zero-filled phase-encoded calibration data set, the empty portions corresponding to other segments of k-space;

Fourier transforming each zero-filled data set to generate one of the phase-correction matrices.

17. The method as set forth in claim 16 wherein the phase-correction matrices generating step further includes:

filtering the data lines.

18. The method as set forth in claim 14, further including:

operating on the composite image with a density correction matrix to generate a density-corrected composite image.

19. The method as set forth in claim 14 further including:

(a) inversely Fourier transforming the composite image in at least a column direction to generate a set of data lines, which set of data lines includes data lines from a central portion of k-space and a second segment of k-space to one side of the central segment;

(b) zero-filling a third segment of k-space to the opposite side of the central segment;

(c) filtering the data lines to extract the data lines from the central segment of k-space, Fourier transforming the extracted data lines to generate a low resolution image, and normalizing the low resolution image to generate a low resolution phase map;

(d) filtering the data lines to extract the data lines from the central and second segments of k-space;

(e) Fourier transforming the extracted data lines to generate an image, taking an absolute value of the image to generate a magnitude image, and combining the magnitude image with the low resolution phase map to generate a complex image;

(f) inversely Fourier transforming the complex image in at least the column direction to generate data lines in the central, second, and third segments of k-space, and filtering the data lines to extract the data lines from the third segment of k-space;

(g) combining the extracted data lines from the central and second segments of k-space with the data extracted from the third segment of k-space and repeating step (e) and step (f) such that the generated complex image is iteratively improved.

20. A method of partial Fourier imaging comprising:

(a) inversely Fourier transforming a composite image in at least a column direction to generate a set of data lines, which set of data lines includes data lines from a central segment of k-space and a second segment of k-space to one side of the central segment;

(b) zero-filling a third segment of k-space to the opposite side of the central segment;

(c) filtering the data lines to extract the data lines from the central segment of k-space, Fourier transforming the extracted data lines to generate a low resolution image, and normalizing the low resolution image to generate a low resolution phase map;

(d) filtering the data lines to extract the data lines from the central and second segments of k-space;

(e) Fourier transforming the extracted data lines to generate an image, taking an absolute value of the image to generate a magnitude image, and combining the magnitude image with the low resolution phase map to generate a complex image;

(f) inversely Fourier transforming the complex image in at least the column direction to generate data lines in the central, second, and third segments of k-space, and filtering the data lines to extract the data lines from the third segment of k-space;

(g) combining the extracted data lines from the central and second segments of k-space with the data extracted from the third segment of k-space and repeating step (e) and step (f) such that the generated complex image is iteratively improved.

\* \* \* \* \*